(12) United States Patent
Hashim et al.

(10) Patent No.: US 6,500,762 B2
(45) Date of Patent: Dec. 31, 2002

(54) METHOD OF DEPOSITING A COPPER SEED LAYER WHICH PROMOTES IMPROVED FEATURE SURFACE COVERAGE

(75) Inventors: Imran Hashim, San Jose, CA (US); Hong-Mei Zhang, Sunnyvale, CA (US); John C. Forster, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/056,751

(22) Filed: Jan. 24, 2002

(65) Prior Publication Data

US 2002/0068449 A1 Jun. 6, 2002

Related U.S. Application Data

(63) Continuation of application No. 09/754,894, filed on Jan. 5, 2001, now Pat. No. 6,391,776, which is a continuation of application No. 09/226,977, filed on Jan. 8, 1999, now abandoned.

(51) Int. Cl.[7] .............................................. H01L 21/44
(52) U.S. Cl. ........................................ 438/687; 438/584
(58) Field of Search ................................. 438/584, 624, 438/629, 637, 639, 666, 672, 680, 685, 687, 758, 766

(56) References Cited

U.S. PATENT DOCUMENTS

| 5,186,718 A | 2/1993 | Tepman et al. |
| 5,236,868 A | 8/1993 | Nulman |
| 5,246,885 A | 9/1993 | Braren et al. |
| 5,312,509 A | 5/1994 | Eschbach |
| 5,316,974 A | 5/1994 | Crank |
| 5,354,712 A | 10/1994 | Ho et al. |
| 5,913,147 A | 6/1999 | Dubin et al. |
| 5,933,753 A | 8/1999 | Simon et al. |
| 5,962,923 A | 10/1999 | Xu et al. |
| 5,969,422 A | 10/1999 | Ting et al. |
| 6,022,800 A | 2/2000 | Ho et al. |
| 6,057,236 A | 5/2000 | Clevenger et al. |

FOREIGN PATENT DOCUMENTS

| EP | 0 799 903 A2 | 10/1997 |
| EP | 0 878 843 A2 | 11/1998 |
| WO | WO98/59087 | 12/1998 |

OTHER PUBLICATIONS

Othon R. Monteiro, "Movel metallization technique for filling 100–nm–wide trenches and vias with very high aspect ratio," J. Vac. Soc. Technol., May/Jun. 1999, pp. 1094–1097, vol. 17, No. 3, American Vacuum Society.

S.M. Rossnagel, "Directional and preferential sputtering–based physical vapor deposition," Thin Solid Films, 1995, pp. 1–12, vol. 263, Elsevier.

(List continued on next page.)

Primary Examiner—David Nelms
Assistant Examiner—David Nhu
(74) Attorney, Agent, or Firm—Shirley L. Church; Kathi Bean

(57) ABSTRACT

We have discovered a method of improving step coverage of a copper seed layer deposited over a semiconductor feature surface which is particularly useful for small size features having a high aspect ratio. We have demonstrated that it is possible to increase the copper seed layer coverage simultaneously at the bottom of a high aspect ratio contact via and on the walls of the via by increasing the percentage of the depositing copper species which are ions. The percentage of species ionization which is necessary to obtain sufficient step coverage for the copper seed layer is a function of the aspect ratio of the feature. An increase in the percentage of copper species which are ionized can be achieved using techniques known in the art, including but not limited to applicants' preferred technique, an inductively coupled RF ion metal plasma.

22 Claims, 5 Drawing Sheets

OTHER PUBLICATIONS

S.M. Rossnagel et al., "Magnetron sputter deposition with high levels of metal ionization," Appl. Phys. Lett., Dec. 13, 1993, pp. 3285–3287, vol. 63, No. 4, American Institute of Physics.

S.M. Rossnagel et al., "Metal ion deposition from ionized mangetron sputtering discharge," J. Vac. Sci. Technol., Dec. 1994, vol. 12, No. 1, pp. 449–453.

S.M. Rossnagel, "Directional Sputter Deposition for Semiconductor Applications," Mat. Res. Symp. Proc., 1995, pp. 503–510, vol. 354, Materials Research Society.

S.M. Rossnagel, "Filling dual damascene interconnect structures with AlCu and Cu using ionized magnetron deposition," J. vac. Sci. Technol., Jan./Feb. 1995, pp. 125–129, vol. 13, No. 1, American Vacuum Society.

S.M. Rossnagel, "Thin, high atomic weight refractory film deposition for diffusion barrier, adhesion layer, and seed layer applications," J. Vac. Sci. Technol., May/Jun. 1996, pp. 1819–1827, vol. 14, No. 3, American Vacuum Society.

A.I. Vladimirov, "Metal–Plasma Source," Institute of Nuclear Research, Academu of Sciences of the Ukranian SSR, Kiev. Trans. from Probory i Teknika Ekspirmenta, No. 2, pp. 136–138, Mar.–Apr. 1987. (Plenum Publishing Corporation.)

METHOD OF DEPOSITING A COPPER SEED LAYER WHICH PROMOTES IMPROVED FEATURE SURFACE COVERAGE

This application is a continuation application of application Ser. No. 09/754,894, filed Jan. 5, 2001, which is U.S. Pat. No. 6,391,776; which is a continuation application of application Ser. No. 09/226,977, filed Jan. 8, 1999, which is abandoned.

BACKGROUND OF THE INVENTION

1. Field of the Invention

The present invention pertains to a method for depositing a copper seed layer having improved step coverage over a feature surface, and to the improved feature structure which is obtained using the method.

2. Brief Description of the Background Art

Due to the difficulty in etching a copper film to provide a desired semiconductor interconnect pattern, one of the preferred methods of providing copper interconnects is the damascene process, which requires the filling of embedded trenches and/or vias.

A typical damascene process for producing a multilevel structure having feature sizes in the range of 0.5 micron ($\mu$) or less would include: blanket deposition of a dielectric material over a semiconductor surface; patterning of the dielectric material to form openings; deposition of a conductive material over the surface of the dielectric material in sufficient amount to fill the openings; and removal of excessive conductive material from the substrate surface using a chemical reactant-based process, mechanical method, or combined chemical-mechanical polishing techniques. Due to problems with copper diffusion into underlying structures, a barrier layer is frequently used between the dielectric material and the copper fill material. In addition, to improve the adhesion of the copper fill to the barrier layer, a seed layer of copper is deposited over the barrier layer prior to deposition of the bulk copper fill material.

A major problem encountered during the copper fill of a feature is the entrapment of void spaces within the copper fill. For example, during copper fill of a feature such as a trench or via using chemical vapor deposition (CVD) there is a tendency to create voids within the filled opening; this is particularly true with regard to high aspect ratio features. Other disadvantages of a CVD process are the contaminants from the CVD reactant deposition source which may be found in the deposited conductive material and the costs associated with use of this technology. Filling of the copper feature with evaporated or sputtered copper is a cleaner process; however, the tendency to form voids still exists. Further, evaporative deposition is a relatively slow process, decreasing production rates. Sputtered copper may be used to provide copper fill, if used in combination with a reflow of the copper. However, the reflow process is typically also a time consuming process.

A typical sputtering technique for filling of high aspect ratio features of less than about 0.5 $\mu$m includes cold (typically below about 150° C.) deposition of sputtered copper over the feature surface, followed by an annealing process (without deposition) at temperatures in excess of about 400° C., to reflow the copper and obtain filling of the trench or via. However, such a reflow process presently is limited to aspect ratios of about 2:1 or less and typically requires more than a half hour of processing time.

U.S. Pat. No. 5,246,885 to Braren et al., issued Sep. 21, 1993, describes the problems listed above, and proposes the use of a laser ablation system for the filling of high aspect ratio features. Alloys, graded layers, and pure metals are deposited by ablating targets comprising more than one material using a beam of energy to strike the target at a particular angle. The ablated material is said to create a plasma composed primarily of ions of the ablated material, where the plasma is translated with high directionality toward a surface on which the material is to be deposited.

U.S. Pat. No. 5,312,509 of Rudolph Eschbach, issued May 17, 1974, discloses a manufacturing system for low temperature chemical vapor deposition of high purity metals. In particular, a semiconductor substrate including etched patterns is plasma cleaned; subsequently, the substrate is coated with adhesion and nucleation seed layers. A reactor connected to the process chamber containing the substrate sublimes a precursor of the metal to be deposited, which is then transported to the substrate. The heated chuck on which the substrate sits heats the substrate above the dissociation temperature of the precursor, releasing the metal from the precursor onto the substrate to nucleate the metal species onto the seed layer on the substrate. Although an adhesion barrier layer and a seed layer (if required) are said to be deposited using sputter deposition, the copper layer is applied solely by CVD deposition, to avoid the sidewall voiding which is said to occur if sputtering is used for the copper deposition.

U.S. Pat. No. 5,354,712 to Ho et al., issued Oct. 11, 1994, describes a method for forming interconnect structures for integrated circuits. Preferably, a barrier layer of a conductive material which forms a seed layer for metal deposition is provided selectively on the side-walls and bottom of interconnect trenches defined in a dielectric layer. Subsequently, a conformal layer of metal is selectively deposited on the barrier layer within the interconnect trench.

Despite all of the above-described development efforts, there remained a need for a method of producing copper interconnect features which did not require the use of particularly complex equipment; which provided good step coverage for small, high aspect ratio features; which could be carried out at temperatures below about 450° C.; and, which produced an interconnect structure which is essentially void-free.

Very recently, copper filled semiconductor features were produced using electroplating techniques employing particularly clean plating solutions. This method for depositing copper works well when a continuous, conformal copper seed layer is in place on the surface of the feature at the time of initiation of electroplating. However, if there are any discontinuities in the copper seed layer, voids are created within the copper fill where there are discontinuities in the seed layer. This makes it critically important to have a continuous copper seed layer over the entire feature surface. When the feature size is small (below 0.25 $\mu$m), and the aspect ratio is high (greater than about 3:1), for example, obtaining a continuous seed layer of copper over the feature surface becomes particularly difficult. FIG. 1A shows a schematic of a cross-sectional view of a copper-filled semiconductor contact via having a bottom diameter of 0.17 $\mu$m and an aspect ratio of about 7:1, where the step coverage of the copper seed layer is inadequate and the copper fill contains numerous voids. To meet the challenge of filling features having aspect ratios of greater than about 3:1, improvements in step coverage, especially sidewall coverage are required.

SUMMARY OF THE INVENTION

We have discovered a method of improving step coverage of a copper seed layer deposited over a semiconductor feature surface which is particularly useful for small size features having a high aspect ratio. Using a contact via as an example of a high aspect ratio feature, we have demonstrated that despite previously-held views, it is possible to increase the copper seed layer coverage simultaneously at the bottom of the via and on the wall of the via by increasing the percentage of the depositing copper species which are ions. Further, the coverage can be optimized by adjusting the bias voltage of (attractive forces on) the semiconductor substrate surface, as a function of the feature dimensions.

The percentage of species ionization which is necessary to obtain sufficient step coverage for the copper seed layer is a function of the aspect ratio of the feature. Although the present invention contemplates the use of deposition species of which at least 30% are ions at the time they contact the substrate, for features having a 0.25 μm or smaller feature size, an aspect ratio of about 3:1 requires that about 50% or more of the copper species be ions at the time of deposition on the substrate. As the aspect ratio increases to about 4:1, the percentage of species which are ions is preferably increased to between about 60% and 70%. When the aspect ratio is about 5:1 or greater, the percentage of species which are ions is preferably increased to greater than 80%. Although it is possible to approach 100% of ionized species, typically the deposition rate decrease makes operation under the required conditions impractical. As a result, for many of the device features contemplated herein, the preferred percentage of ionization ranges between about 50% and about 90%.

This increase in the percentage of copper species which are ionized can be achieved using techniques known in the art, based on laser ablation of the copper target, electron cyclotron resonance, hollow cathode, and applicants' preferred technique, inductively coupled RF plasma. The use of an inductively coupled RF plasma is described in detail herein.

We have discovered that when an inductively coupled plasma is used to increase ionization, an increase in RF power to the ionization source is not enough to obtain the desired percentage of ions in many cases. It is also necessary to increase the plasma gas pressure. Typically, the plasma gas is argon, although other inert gases such as krypton and xenon can be used as well. In fact, the higher mass gases such as krypton or xenon may be very effective in ionizing copper atoms, although argon is preferred due to its availability and lower cost. The plasma gas pressure in the copper seed layer deposition chamber is increased to fall within the range of about 20 mTorr to about 100 mTorr, preferably between about 30 mTorr and 70 mTorr, to achieve the desired percentage of ions in the plasma.

DETAILED DESCRIPTION OF THE PREFERRED EMBODIMENTS

Figure 1A:
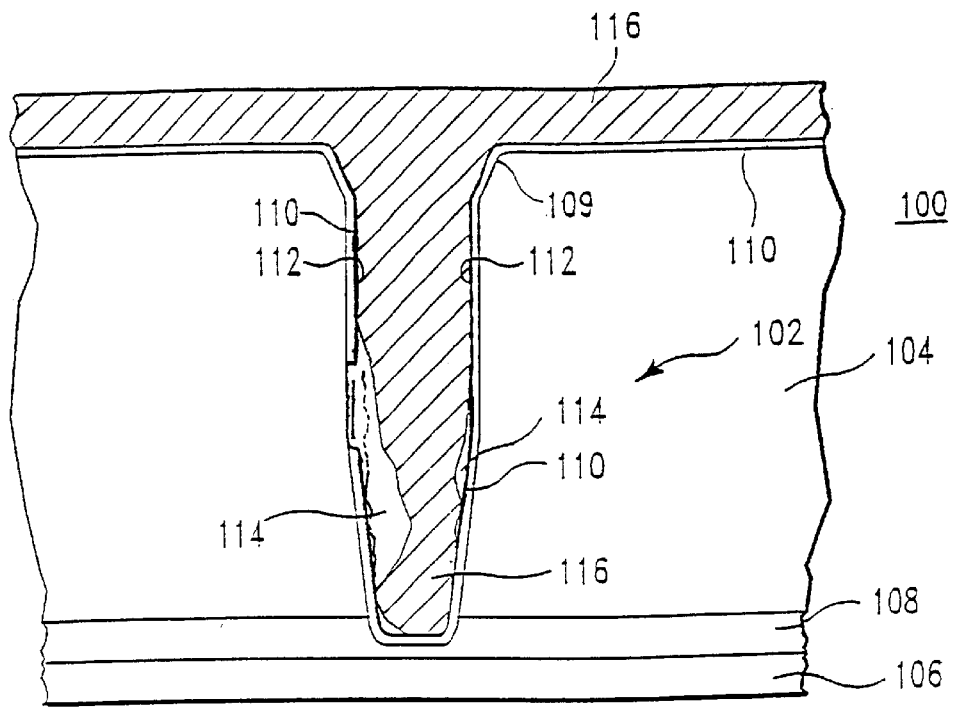
FIG. 1A shows a schematic of a transmission electron microscope (TEM) cross-sectional image of a copper-filled contact obtained using prior art methods for deposition of the copper seed layer.

The present invention pertains to a method of improving step coverage of a copper seed layer deposited over a semiconductor feature surface, and is particularly useful for small size features having a high aspect ratio. Improvement of the step coverage refers to improvement of the ability to apply a continuous coating over a feature surface despite feature topography. The method is based on the discovery that it is possible to simultaneously increase the amount of bottom coverage and sidewall coverage over a feature surface during the deposition of a given thickness of material over the field surface of a semiconductor substrate. This simultaneous increase depends on providing copper species at the surface of the substrate which contain at least a given percentage of ions (the percentage required depends on the feature size and the aspect ratio of the feature). Further, when using the apparatus of our preferred embodiments, the percentage of species which are ions is increased by increasing the pressure in the copper deposition process chamber.

I. Definitions

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor.

Specific terminology of particular importance to the description of the present invention is defined below.

The term "aspect ratio" refers to, but is not limited to, the ratio of the height dimension to the width dimension of a particular feature. When the feature has more than one width dimension, the aspect ratio is typically calculated using the smallest width dimension of the feature. For example, a contact via opening which typically extends in a tubular form through multiple layers has a height and a diameter, and the aspect ratio would be the height of the tubular divided by the diameter. The aspect ratio of a trench would be the height of the trench divided by the minimal width of the trench, which typically occurs at its base.

The term "bottom coverage" refers to, but is not limited to, the thickness of a deposited material in the bottom of a feature as a fraction (or percentage) of the deposition at the top (typically on the field surface) of the feature.

The term "completely filled" refers to the characteristic of the copper-filled feature, wherein there is essentially no void space present in the copper-filled feature.

The term "copper" refers to copper and alloys thereof, wherein the copper content of the alloy is at least 80 atomic %. The alloy may comprise more than two elemental components.

The term "essentially void free feature" refers to, but is not limited to, a feature which comprises a volumetric opening or space which is filled with a deposited material, wherein the filled volume is essentially free of void spaces.

The term "feature" refers to, but is not limited to, contacts, vias, trenches, dual damascene structures, and other structures which make up the topography of the substrate surface.

The terms "ion-deposition sputtered", "ion metal plasma (IMP)", and "high density plasma sputtered" refer to sputter deposition where the percentage of species depositing on the substrate which are ionized is typically greater than about 50% There are various methods for accomplishing ion-deposition sputtering, such as laser ablation of the copper target, electron cyclotron resonance, hollow cathode, and our preferred technique, inductively coupled RF plasma. The use of an inductively coupled RF plasma is described in detail herein. Our inductively coupled plasma deposition preferably employs magnetron sputter deposition (where a magnet array is placed behind the target). A high density, inductively coupled RF plasma is created between the sputtering cathode and the substrate support electrode (pedestal), whereby an increased portion of the sputtered emission is in the form of ions at the time it reaches the substrate surface.

The terms "ion-deposition sputtered copper", "IMP copper", or "high density plasma sputtered copper" refer to a copper deposition which was sputtered using the techniques described above.

The terms "reactive ion-deposition", "reactive ion metal plasma (IMP)", or "reactive high density plasma deposition" refer to sputtering of the kind described above, wherein a reactive gas is supplied during the sputtering to react with the ionized material being sputtered, producing an ion-deposition sputtered compound containing the reactive gas element.

The term "sidewall coverage" refers to, but is not limited to, the thickness of deposited material on the sidewall of the feature as a fraction (or percentage) of the thickness at the top (typically on the field surface) of the feature.

The term "standard copper deposition" or "traditional sputtering" refers to a method of forming a film layer on a substrate wherein a target is sputtered and the material sputtered from the target passes between the target and the substrate to form a film layer on the substrate, and no means is provided to ionize a substantial portion of the material sputtered from the target before it reaches the substrate.

The term "TEM" refers to a transmission electron microscope.

II. An Apparatus for Practicing the Invention

A process system which can be used to carry out the pre-cleaning step, the deposition of barrier layers and the deposition of copper seed layers is the ENDURA® Integrated Processing System available from Applied Materials, Inc. (Santa Clara, Calif.) The system is shown and described in U.S. Pat. Nos. 5,186,718 and 5,236,868, the disclosures of which are incorporated by reference.

Figure 5:
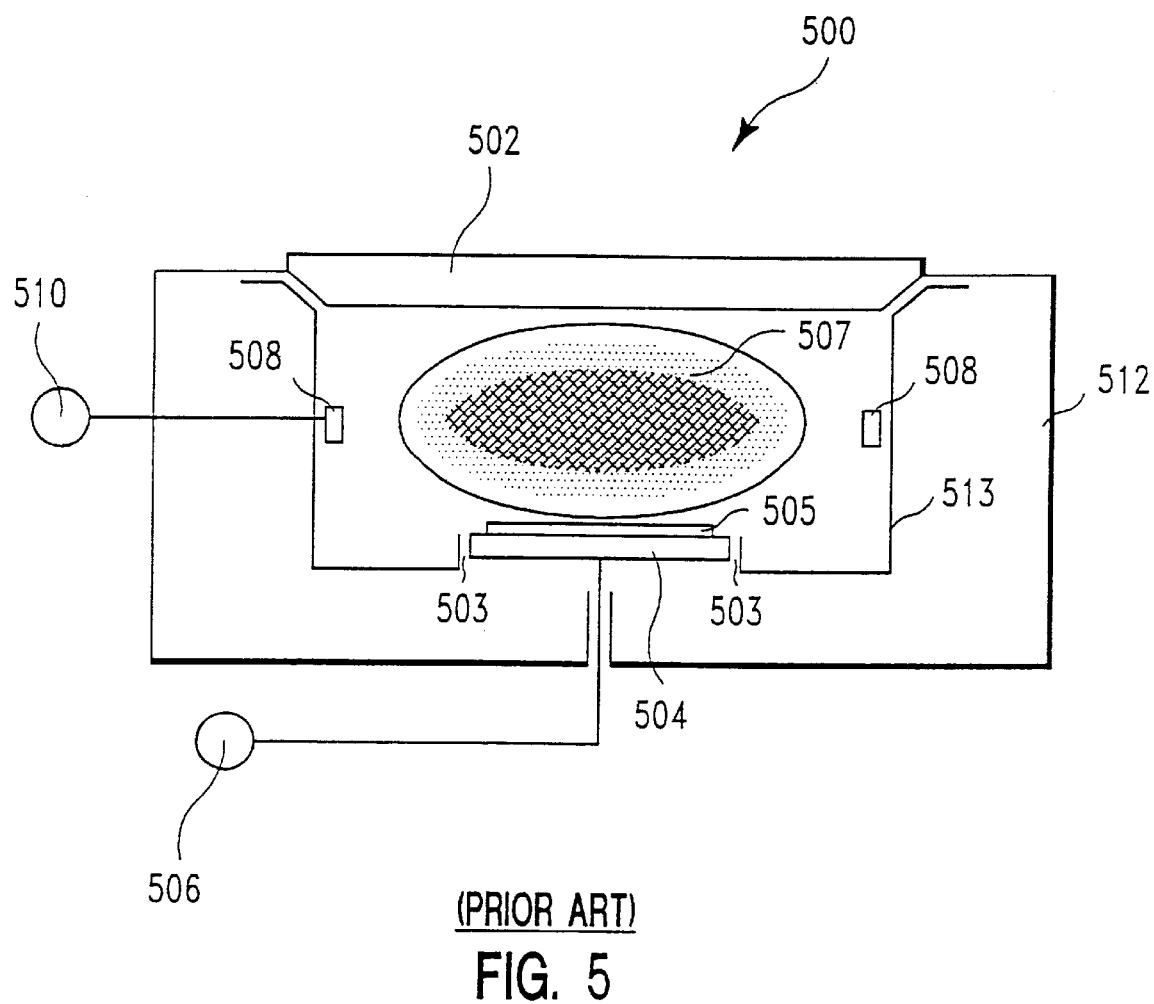
FIG. 5 is a schematic of a cross-sectional view of a sputtering chamber of the kind which can be used to deposit a copper seed layer using the method of the present invention. This illustration shows the critical elements of a high density plasma (ion-deposition) sputtering chamber (or reactive-ion-deposition sputtering chamber). The critical elements include a sputtering target to which DC power is applied, an RF powered coil for creating and maintaining ionized species within a plasma over the surface of the semiconductor substrate being processed, and a means for application of RF power to the support pedestal on which the substrate sets, enabling the creation of an enhanced bias on the substrate. When RF power is applied to the support pedestal, this enables a more anisotropic direction of the ions toward the substrate and control over the amount of force with which the ions strike the substrate.

To further illustrate a typical apparatus which can be used to accomplish ion-deposition sputter deposition from a desired target material, FIG. 5 is a schematic of a cross sectional view of the critical elements of an ion-deposition sputtering system. Process chamber 500 may be used to deposit a copper seed layer using the method of the present invention.

Process chamber 500 is typically a magnetron chamber which employs a standard sputter magnet (not shown) to confine the sputtering plasma, enabling an increased sputtering rate. In addition, the process chamber includes an inductively coupled RF source 510 preferably located interior to the process chamber walls when the material being sputtered is a metal. RF source 510 is typically in the form of a single, flat coil 508, positioned between a sputtering cathode (target) 502 and the substrate support electrode 504, whereby a larger portion of the sputtered emission is in the form of ions at the time it reaches the substrate surface. An RF power source 506 may be (optionally) used to apply a bias to substrate support electrode 504, increasing the DC bias on semiconductor substrate 505. Typically a shield 513 surrounds the area in which plasma 507 is created from gases which enter through channels 503. Shield 513 is surrounded by a vacuum chamber 512 which enables the evacuation of gases from the substrate processing area through evacuation channels (not shown). In the preferred embodiment of the present invention, argon is typically the gas used to create sputtering ions which impinge upon target 502 to produce depositing species such as copper species in the present instance.

When it is desired to apply a fill layer of copper using an electroplating process, this is preferably done in an electroplating bath of the kind known in the art, wherein the reagents used in the electroplating process are of high purity. Such electrolytes are available from Enthone-OMI having a sales office in Manhattan Beach, Calif. Electroplating of copper is generally described in Ullmann's Encyclopedia of Industrial Chemistry, Sixth Edition, 1998, and electroplating equipment which can be used for copper plating of semiconductor surfaces is available from SEMITOOL® of Kalispell, Mont. The electroplating may be done using DC only or DC-pulsed methods of application.

It is preferred that the semiconductor structure not be exposed to air or moisture after deposition of the barrier layer, until at least the seed layer of copper has been applied over the barrier layer. It is preferred that the remainder of process steps are completed through application of the copper fill via electroplating or other means while the semiconductor structure is under a controlled ambient, to avoid the formation of copper oxides and the corrosion of the copper in general within the interior of the feature.

III. The Method of the Invention

Prior to the present invention, the theory was that deposition of a layer of copper of a given thickness on the field surface of a semiconductor substrate provided a fixed number of copper atoms available to cover the surface of a feature (such as a contact via) residing within the substrate and open to the substrate surface. One could calculate the amount of copper atoms deposited over the surface area of the opening and these would be the atoms available to deposit over the feature surface underlying the opening. As a result, by changing process parameters such that more of these copper atoms were applied to the bottom of a contact or via, there would be less copper atoms available to cover the sidewalls of the via. We have discovered that this is not the case. We have discovered that it is possible to simultaneously increase the bottom coverage and sidewall coverage of a contact via, provided a certain percentage of the copper species applied to the substrate are ions. A possible explanation is that by increasing ionization of the depositing metal, more of the copper species are attracted to the negatively biased wafer and are able to penetrate deeper into higher aspect ratio features. Furthermore, the increased ionization may decrease the sticking coefficient of depositing copper atoms to less than one, leading to more scattering and redistribution of material from the bottom of the feature to the sidewalls. The required percentage of ionization (or the ionized fraction) of the copper species striking the substrate surface depends on the feature size and the aspect ratio of the feature. For example, a contact via having a feature size of about 0.25 µm or less and an aspect ratio of about 3:1 requires that about 50% or more of the copper species be ions at the time of deposition on the substrate, to provide a preferred, continuous sidewall coverage of the copper seed layer. As the aspect ratio increases to about 4:1, the percentage of species which are ions is preferably increased to between about 60% and 70%. When the aspect ratio is about 5:1 or greater, the percentage of species which are ions is preferably increased to greater than 80%.

Figure 1B:
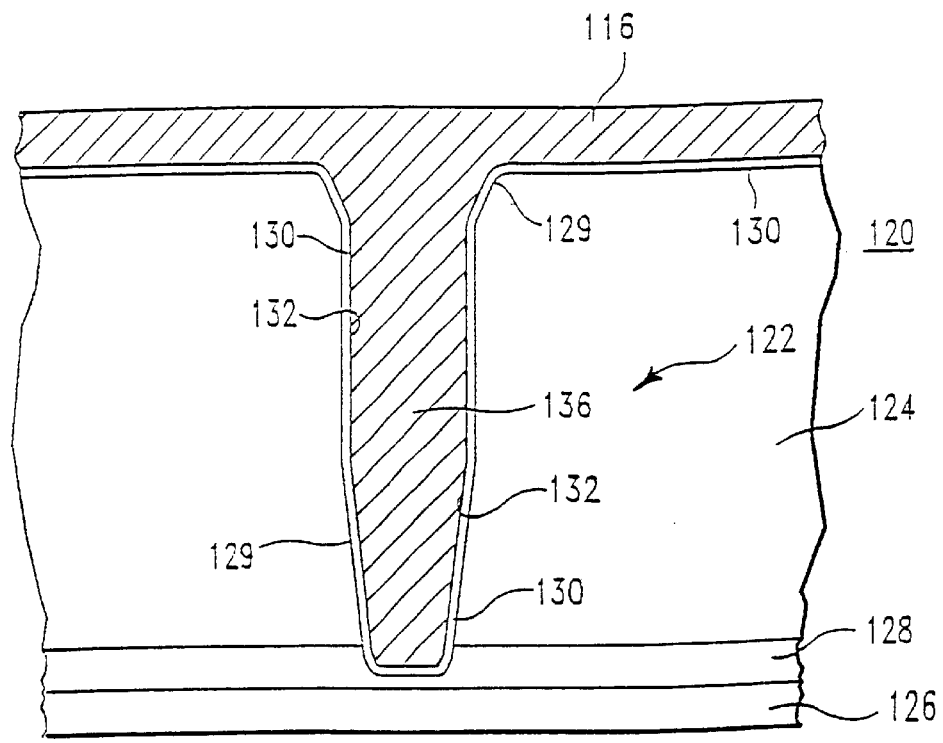
FIG. 1B shows a schematic of a TEM cross-sectional image of a copper-filled contact obtained using the method of the present invention for deposition of the copper seed layer.

FIG. 1B shows a schematic of a TEM cross-sectional view of a semiconductor structure 120 formed using the method of the present invention, which structure 120 includes a contact via 122 formed therein. The open surface 129 of a contact via 122 is typically obtained by plasma etching of a layer of dielectric substrate 124 (typically silicon dioxide). When the dielectric substrate 124 would be in contact with a copper fill 126, and the dielectric material (such as silicon oxide) is susceptible to diffusion by copper, a barrier layer 130 is generally used between the copper and the dielectric material. To provide improved adhesion of copper within the contact via 122, a copper seed layer 132 is typically applied over barrier layer 130 prior to application of the bulk of the copper fill material.

The preferred embodiments described herein are with reference to a substrate 126 which depends on the device functionality required. In the present instance, an etch stop layer 128 of silicon nitride (other similar etch stop materials may be used) was deposited over substrate 126, and a dielectric layer 124 of silicon oxide (other dielectric materials may be used) was applied over the silicon nitride etch stop layer 128. A contact via opening surface 129 having a feature size of about 0.17 µm and an aspect ratio ranging from about 5 to about 7 was etched into silicon oxide layer 124. Subsequently, a barrier layer 130 of tantalum nitride was applied over the interior surface of 129 of silicon oxide using a reactive plasma vapor deposition technique of the kind known in the art. (It is understood that should a dielectric material which is not subject to diffusion by copper be used, such a barrier layer would not be necessary.) In the preferred embodiments described herein, the tantalum nitride barrier layer was deposited using reactive ion-metal plasma sputtering techniques of the kind described subsequently herein. However, other deposition techniques such as CVD may be used as well. Typically the tantalum nitride barrier layer 130 thickness ranged from about 150 to about 500 Å. We most commonly used a barrier layer 130 thickness of about 250 Å. (It is understood that other, alternative barrier layer materials such a tantalum, titanium, titanium nitride, tungsten, and tungsten nitride may be used as well.)

Overlying barrier layer 130, a copper "seed" layer 132 was applied. And, finally, a copper fill layer 136 was applied over copper seed layer 132. The purpose of the copper seed layer 132 is to improve the adhesion of the copper fill 136 to barrier layer and to provide the desired crystalline structure (preferably <111>) for transfer to copper fill 136. The copper fill 136 may be applied using sputtering techniques under specialized conditions, such as those described in co-pending U.S. patent application Ser. No. 08/855,059, filed May 13, 1997, titled: "Method of Sputtering Copper to Fill Trenches and Vias". This patent application is assigned to the assignee of the present invention and is hereby incorporated by reference in its entirety.

The copper fill may also be applied using techniques which provide a conformal layer of copper, such as CVD, evaporation, or electroplating. In the present preferred embodiments, electroplating was used to provide copper fill 136.

EXAMPLE ONE—Comparative Example

FIG. 1A illustrates the prior art, which is improved upon by the present invention. FIG. 1A shows a schematic of a TEM cross-sectional view of a semiconductor structure 100 which includes a contact via 102 formed therein. The feature size of contact via 102 was 0.17 µm, and the aspect ratio was about 7.

The open surface 109 of contact via 102 was obtained by plasma etching of a layer of silicon oxide substrate 104 using techniques generally known in the art. A barrier layer 110 of tantalum nitride was applied using ion metal plasma-deposition sputtering conditions. In particular, the plasma source power was 1 kW DC; the RF power to the ionization coil was 1.5 kW at 2 MHz; the plasma gas flow was 50 sccm argon and 20 sccm $N_2$; the process vessel pressure was 28 mTorr; the RF power applied to the substrate support pedestal was 350 W at 13.56 MHz, applied only during the latter half of the deposition process.

Subsequently, a copper seed layer 112 was applied using the following process conditions. Process chamber pressure was 20 mTorr; plasma source power was 2 kW DC; the power to the ionization coil was 2 kW; the power applied to the substrate support pedestal was 350 W during the latter half of the deposition process. The plasma source gas was argon. The target composition was 100% copper. The substrate temperature during deposition was less than 100° C.; the substrate support pedestal temperature was less than 50° C.

These process conditions resulted in an ionized percentage of about 45% of the copper species striking the substrate surface. The bottom coverage was less than about 10%, and sidewall coverage varied from about 0% to about 10%.

A copper fill layer 116 was applied over copper seed layer 112 using electroplating techniques known in the art. Voids 114 were formed along the sidewalls of contact via 102, leaving an incomplete fill of contact via 102 as shown in FIG. 1A.

EXAMPLE TWO—A Preferred Embodiment of the Present Invention

FIG. 1B illustrates a filled contact via prepared using the method of the present invention. FIG. 1B shows a schematic of a TEM cross-sectional view of a semiconductor structure 120 which includes a contact via 122 formed therein. The feature size of contact via 122 was 0.17 μm, and the aspect ratio was about 7.

The preferred embodiments described herein were produced in a process chamber capable of processing a 200 mm diameter silicon wafer. The open surface 129 of contact via 122 was obtained by plasma etching of a layer of silicon oxide substrate 124 using techniques generally known in the art A barrier layer 130 of tantalum nitride was applied using ion metal plasma-deposition sputtering conditions in the manner described with reference to FIG. 1A.

Subsequently, a copper seed layer 132 was applied using the following process conditions. The process chamber pressure was 60 mTorr; the plasma source power was 1 kW DC; the ionization coil power was 2 kW at 2 MHz; the RF bias power to the substrate support pedestal was 350 W at 13.56 MHz during the latter half of deposition. The plasma source gas was argon. The target composition was 100% copper. The substrate temperature during deposition was less than 100° C.; the substrate support pedestal and the process chamber wall temperature was about 50° C. The thickness of the copper seed layer on the field surface was about 200 nm.

These process conditions resulted in an ionized percentage of about 80% of the copper species striking the substrate surface. The bottom coverage was greater than about 20%, and sidewall coverage varied from about 5% to about 10%

A copper fill layer 136 was applied over copper seed layer 132 using electroplating techniques known in the art. No voids were formed within copper fill layer 136 or along the sidewall areas of the via 122.

The enhanced step coverage achieved by the method of the present invention is obtained as a result of the increased percentage of ions in the copper species contacting the substrate surface, as previously described. The increase in the percentage of ions is achieved in part due to use of the internal ionization coil 508 described with reference to FIG. 5. However, we discovered that, due to the nature of the copper atoms, it is necessary to drastically increase the process chamber pressure during the deposition of copper, as compared with process chamber pressures used for ion-deposition sputtering of other materials (such as titanium, for example). It appears that the higher process chamber pressures slow the progress of sputtered copper atoms through the area of ionization coil 508 due to increased collisions with argon atoms (used as the plasma source). This permits more copper atoms to be ionized by the RF power supplied to ionization coil 508. The percentage of ionization can be increased by increasing the RF power itself, but we have found that this alone is not generally adequate to obtain the desired ionization percentage for copper species contacting the substrate. As previously described, the process chamber pressure required is a function of the feature size and aspect ratio. However, for feature sizes of about 0.25 μm or less, having an aspect ratio of about 4 or greater, it is typically necessary to use a process chamber pressure in excess of 30 mTorr, and preferably in excess of 50 mTorr. In the particular apparatus we used, a process chamber pressure between about 40 mTorr and about 0.5 Torr is recommended, with a preferred range being between about 40 mTorr and about 0.5 Torr, and a most preferred range being between about 40 mTorr and about 100 mTorr.

Figure 2A:
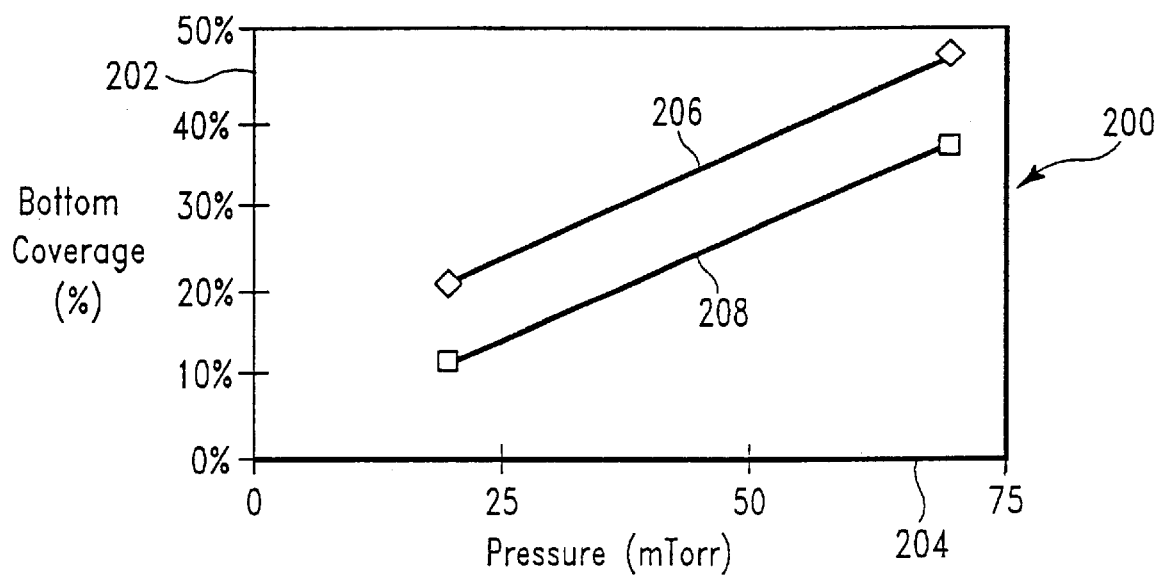
FIG. 2A shows the bottom coverage obtained for a 0.25 μm diameter contact via having an aspect ratio of about 5:1, as a function of the chamber pressure in the copper deposition process chamber, when a lower level power is applied to the plasma used to impact the sputtering target.

FIG. 2A shows a plot 200 of per cent bottom coverage (on vertical axis 202) obtained for a copper seed layer deposited by the method of the invention (described with reference to FIG. 1) as a function of the process chamber pressure (on horizontal axis 204). Curve 206 represents data at the center of a semiconductor wafer substrate, while curve 208 represents data at the edge of the semiconductor wafer substrate. The general process conditions held constant were plasma source power at 1 kW DC; ionization coil power at 2 kW RF (@ 2 MHZ); no RF power to the substrate support platen; substrate temperature was less than about 100° C.; process chamber wall temperature and substrate support pedestal temperature were less than about 50° C.

Figure 2B:
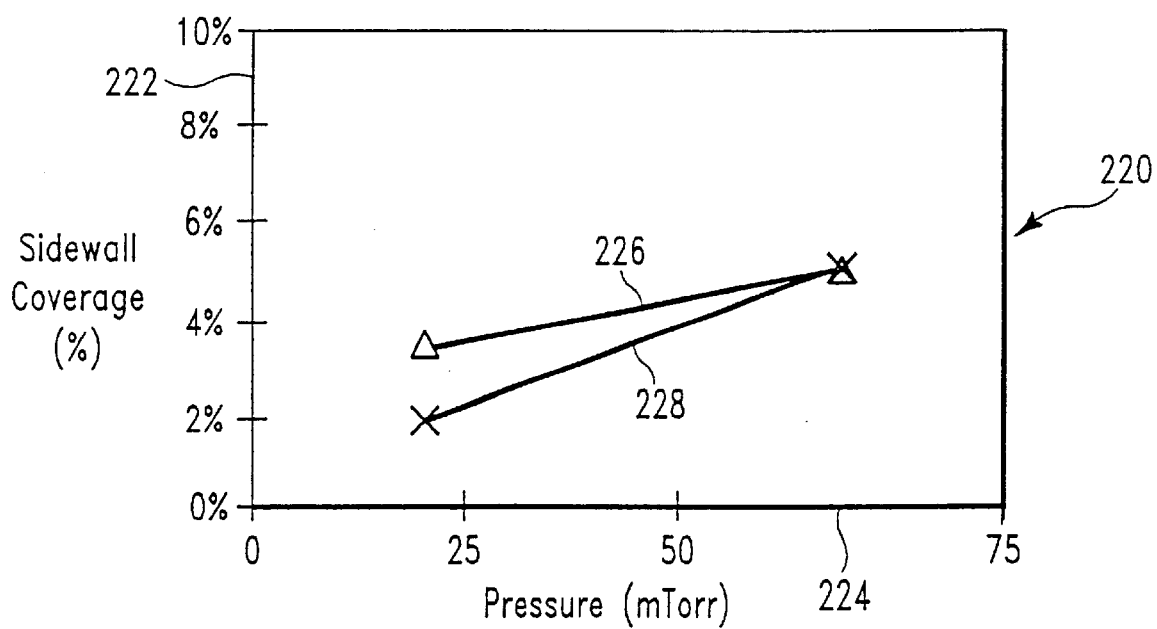
FIG. 2B shows the sidewall coverage obtained for the 0.25 μm diameter contact via shown in FIG. 2A.

FIG. 2B shows a plot 220 of minimum per cent sidewall coverage (on vertical axis 222) obtained for a copper seed layer deposited by the method of the invention (described with reference to FIG. 1) as a function of the process chamber pressure (on horizontal axis 224). Curve 226 represents data at the center of a semiconductor wafer substrate, while curve 228 represents data at the edge of the semiconductor wafer substrate. The general process conditions held constant were the same as described with reference to FIG. 2A.

The unexpected results illustrated by FIG. 2A in combination with FIG. 2B is that it is possible to simultaneously increase both bottom coverage and sidewall coverage of the interior of a contact via surface while depositing copper species by increasing the pressure in the process chamber.

Figure 3A:
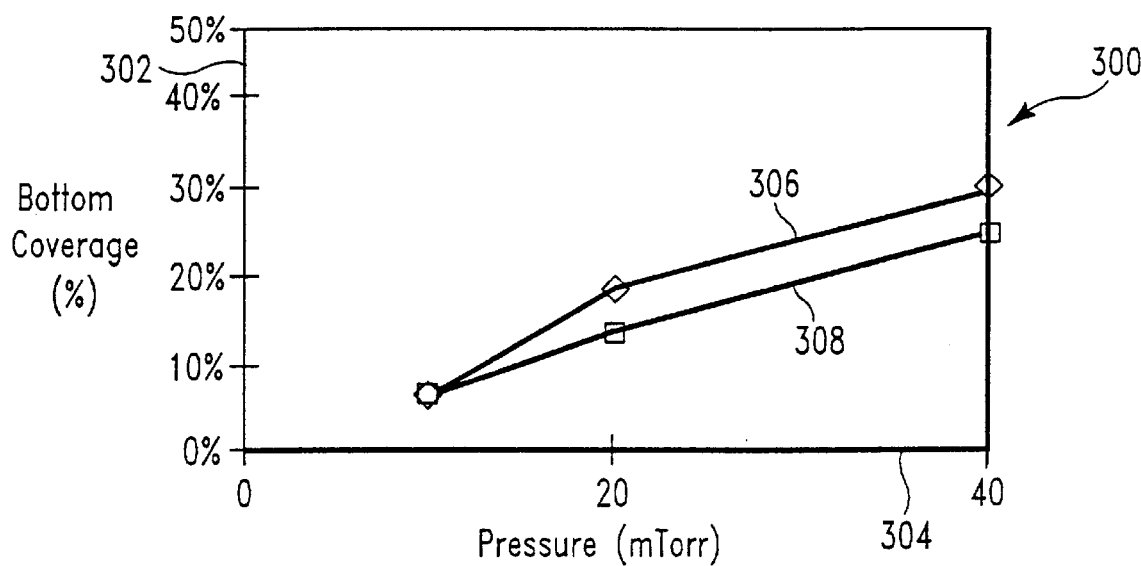
FIG. 3A shows the bottom coverage obtained for a 0.25 μm diameter contact via having an aspect ratio of about 5:1, as a function of the chamber pressure in the copper deposition process chamber, when the power applied to the target sputtering plasma is twice the power which was used for the FIG. 2A contact via.

FIG. 3A shows a plot 300 of per cent bottom coverage (on vertical axis 302) obtained for a copper seed layer deposited by the method of the invention (described with reference to FIG. 1) as a function of the process chamber pressure (on horizontal axis 304). Curve 306 represents data at the center of a semiconductor wafer substrate, while curve 308 represents data at the edge of the semiconductor wafer substrate. The general process conditions held constant were plasma source power at 2 kW DC; ionization coil power at 2 kW RF (@ 2 MHZ); no RF power to the substrate support platen; substrate temperature was less than about 100° C.; process chamber wall temperature and substrate support pedestal temperatures were less than about 50° C.

Figure 3B:
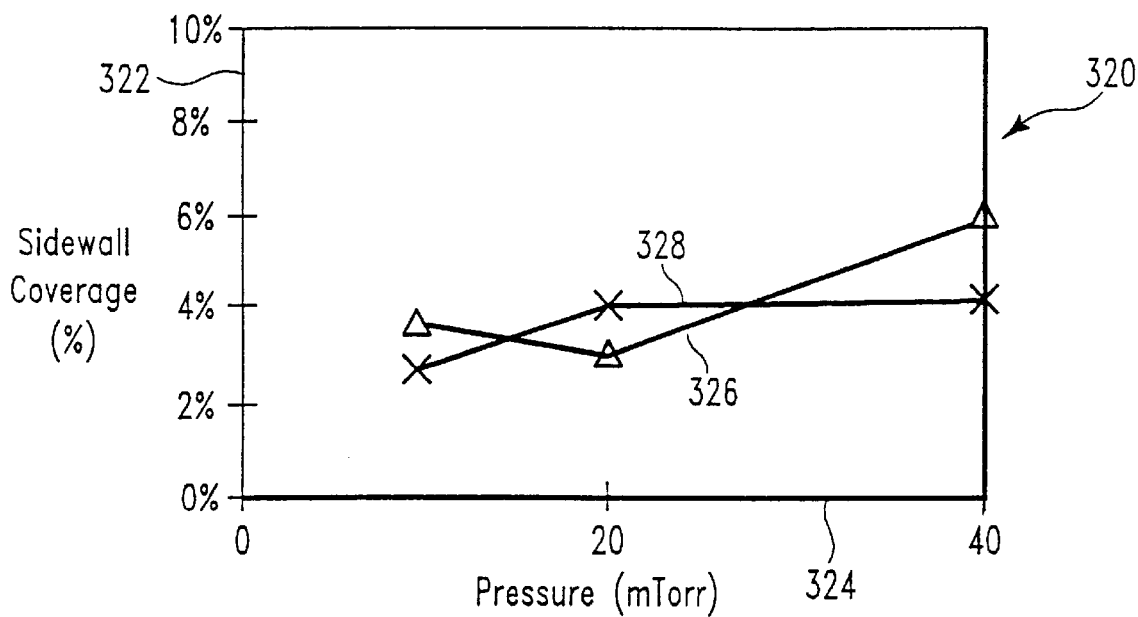
FIG. 3B shows the sidewall coverage obtained for the 0.25 μm diameter contact via shown in FIG. 3A.

FIG. 3B shows a plot 320 of minimum per cent sidewall coverage (on vertical axis 322) obtained for a copper seed layer deposited by the method of the invention (described with reference to FIG. 1) as a function of the process chamber pressure (on horizontal axis 324). Curve 326 represents data at the center of a semiconductor wafer substrate, while curve 328 represents data at the edge of the semiconductor wafer substrate. The general process conditions held constant were the same as described with reference to FIG. 3A.

The main difference between the FIGS. 2A and 2B and the FIGS. 3A and 3B process conditions is the increased plasma source DC power (which was increased from 1 kW to 2 kW). Once again, the bottom coverage is significantly increased as process chamber pressure is increased. It appears that sidewall coverage is also significantly increased, although the data for sidewall coverage at the edge of the semiconductor substrate, as illustrated by curve 328 is not conclusive. It may be that at higher chamber pressures (above 40 mT), the data would be more conclusive for edge-of-wafer sidewall coverage. However, the higher plasma source power leads to increased deposition rates which result in inefficient ionization. For this particular equipment, lower source powers in the range of about 1 kW are preferred.

Figure 4A:
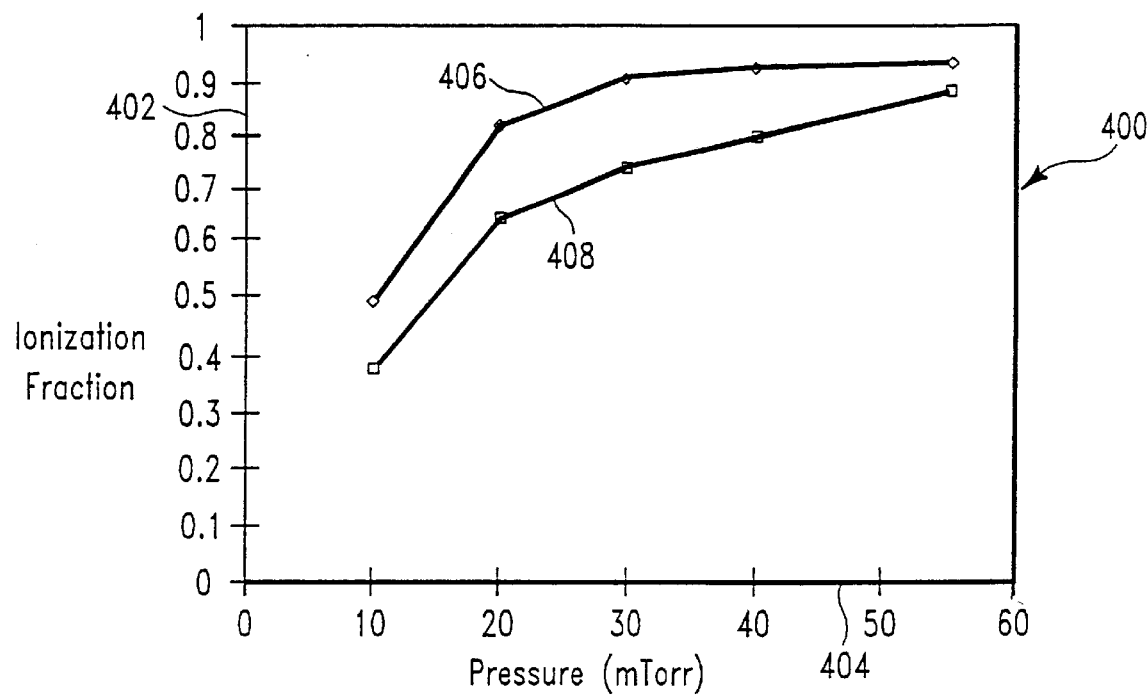
FIG. 4A shows a simulated copper species ionization fraction as a function of the pressure in the copper deposition process chamber. The simulation is based on HPEM (Hybrid Plasma Equipment Model) Code available from Professor Mark Kushner, University of Illinois.

FIG. 4A shows a plot 400 of simulated ionization fraction (which can be converted to percent by multiplying by 100) as a function of the process chamber pressure, all other variables held constant at the values specified with reference to FIGS. 2A and 2B. Ionization fraction is shown on vertical axis 402 and process chamber pressure is shown on horizontal axis 404. Curve 406 represents data at the center of the semiconductor wafer substrate, while curve 408 represents data at the edge of the semiconductor wafer substrate. FIG. 4A illustrates that an increase in process chamber pressure is helpful in increasing both the ionization fraction, and at higher pressures (50 mTorr and higher) is helpful in obtaining uniformity of ionization fraction across the substrate.

Figure 4B:
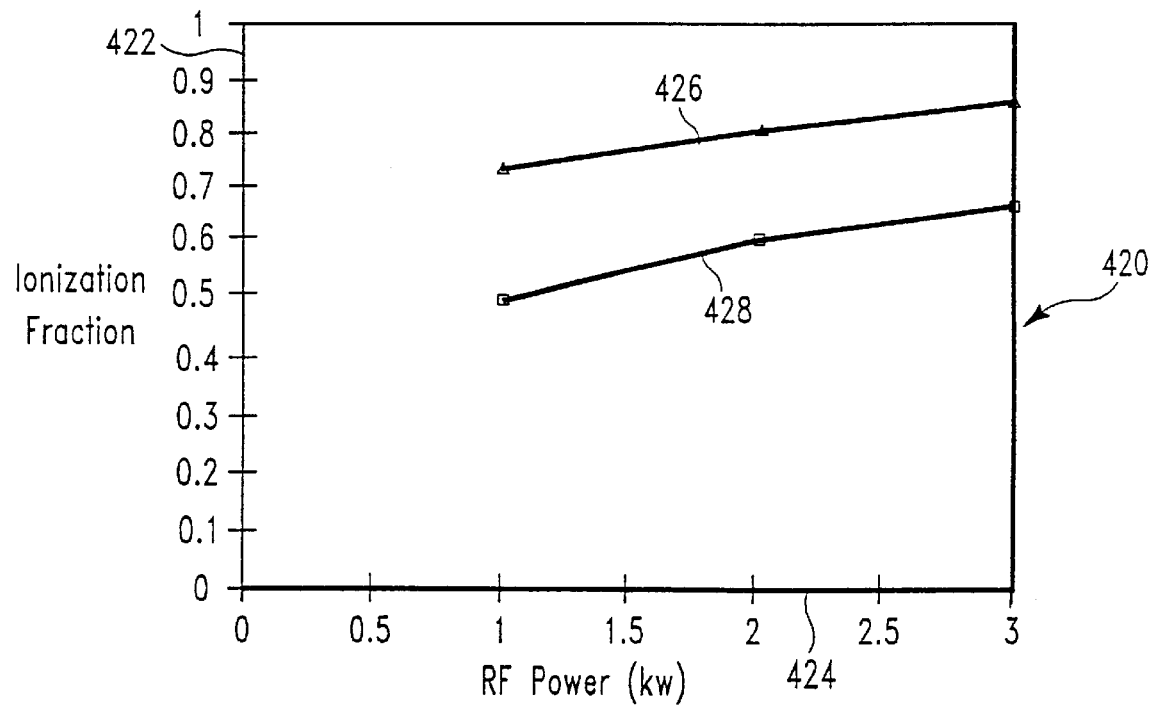
FIG. 4B shows the copper species ionization fraction as a function of the power to an internal ionization coil which is positioned between the sputtering target and the substrate support pedestal within the copper deposition process chamber.

FIG. 4B shows a plot 420 of ionization fraction as a function of the power applied to the ionization coil, all other variables held constant at the values specified with reference to FIG. 4A and at a process chamber pressure of 20 mTorr. Curve 426 represents data at the center of the semiconductor wafer substrate, while curve 428 represents data at the edge of the wafer substrate. Not only is the ionization fraction lower than desired at the edge of the wafer substrate, but an increase in power to the ionization coil does not provide a uniform ionized fraction across the substrate surface. where the present invention could be used to ensure a sufficient step coverage of the seed layer to enable the complete filling of copper interconnect and contact features. Such semiconductor structures may include the use of a dielectric substrate other than silicon dioxide (such as a low k polymeric dielectric substrate); may include the use of barrier layers other than tantalum nitride, such as tantalum, titanium, titanium nitride, tungsten, tungsten nitride, or combinations thereof; may include a wetting layer of a material other than copper (such as aluminum); and may include the use of a copper fill layer applied by a techniques other than electrolytic plating. In addition, the high ionization fraction may be obtained using apparatus known in the art, other than that described herein. The above described preferred embodiments are not intended to limit the scope of the present invention, as one skilled in the art can, in view of the present disclosure expand such embodiments to correspond with the subject matter of the invention claimed below.

We claim:

1. A method of providing a copper seed layer over an interior surface of a feature upon or within a semiconductor substrate, said method comprising: depositing said copper seed layer over said interior surface of said feature using copper species wherein at least 30 percent of said species are in the form of copper ions at the time said species contact said substrate surface, and wherein a bias voltage on said substrate surface is adjusted during deposition of said copper seed layer, so that a continuous copper seed layer is formed over said interior surface of said feature.

2. The method of claim 1, wherein said bias voltage is adjusted by adjusting an RF bias power to a substrate support platen during deposition of said copper seed layer.

3. The method of claim 2, wherein said RF bias power is increased as deposition of said copper seed layer progresses.

4. The method of claim 1, wherein said percent of species which are copper ions ranges between about 50% and about 100%.

5. The method of claim 4, wherein said percent of species which are copper ions ranges between about 50% and about 90%.

6. The method of claim 5, wherein said percent of species which are copper ions ranges between about 60% and about 90%.

7. The method of claim 1, wherein said feature has a feature size of 0.25 μm or less and an aspect ratio of about 3:1 or greater, and wherein said percent of species which are copper ions is at least about 50%.

8. The method of claim 7, wherein said feature has an aspect ratio of about 4:1 or greater, and wherein said percent of species which are copper ions is at least about 60%.

9. The method of claim 8, wherein said feature has an aspect ratio of about 5:1 or greater, and wherein said percent of species which are copper ions is at least about 80%.

10. The method of claim 1, wherein said percentage of copper species which are ions is obtained by ion deposition sputtering, wherein power is applied to an ionizing device located between a source of said copper species and said semiconductor substrate, and wherein the ambient pressure surrounding the copper species at the time of application of the ionization energy provided by said RF power source is at least 30 mTorr.

11. The method of claim 10, wherein said ambient pressure is at least 40 mTorr.

12. The method of claim 11, wherein said ambient pressure is at least 60 mTorr.

13. A method of providing a complete copper fill of a semiconductor feature upon or within a semiconductor substrate, said method comprising: depositing a continuous copper seed layer over an interior surface of said feature using copper species wherein at least 30 percent of said species are in the form of copper ions at the time said species contact said substrate surface, and wherein a bias voltage on said substrate surface is adjusted during deposition of said copper seed layer; and subsequently depositing a copper fill layer over said continuous copper seed layer.

14. The method of claim 13, wherein said bias voltage is adjusted by adjusting an RF bias power to a substrate support platen during deposition of said copper seed layer.

15. The method of claim 14, wherein said RF bias power is increased as deposition of said copper seed layer progresses.

16. The method of claim 13, wherein said percent of said copper species which are ions ranges between about 30% and about 90%.

17. The method of claim 16, wherein said percent of said copper species which are ions ranges between about 50% and about 90%.

18. The method of claim 17, wherein said percent of said copper species which are ions ranges between about 70% and about 90%.

19. The method of claim 13, wherein said feature has a feature size of 0.25 μm or less and an aspect ratio of about 3:1 or greater, and wherein said percent of species which are copper ions is at least about 50%.

20. The method of claim 19, wherein said feature has an aspect ratio of about 4:1 or greater, and wherein said percent of species which are copper ions is at least about 60%.

21. The method of claim 20, wherein said feature has an aspect ratio of about 5:1 or greater, and wherein said percent of species which are copper ions is at least about 80%.

22. The method of claim 13, wherein said percentage of copper species which are ions is obtained by ion deposition sputtering, wherein power is applied to an ionizing device located between a source of said copper species and said semiconductor substrate, and wherein the ambient pressure surrounding the copper species at the time of application of the ionization energy provided by said RF power source is at least 30 mTorr.

* * * * *